United States Patent [19]
Iizuka et al.

[11] Patent Number: 6,117,729
[45] Date of Patent: Sep. 12, 2000

[54] NONVOLATILE SEMICONDUCTOR STORAGE DEVICE AND ITS MANUFACTURING METHOD

[75] Inventors: Hirohisa Iizuka, Yokohama; Shinji Satoh; Riichiro Shirota, both of Fujisawa, all of Japan

[73] Assignee: Kabushiki Kaisha Toshiba, Kawasaki, Japan

[21] Appl. No.: 09/097,152

[22] Filed: Jun. 12, 1998

[30] Foreign Application Priority Data

Jun. 13, 1997 [JP] Japan .................................. 9-157122

[51] Int. Cl.[7] .............................................. H01L 21/8247
[52] U.S. Cl. ............................................. 438/258; 438/264
[58] Field of Search ..................................... 438/257–267

[56] References Cited

U.S. PATENT DOCUMENTS

| | | |
|---|---|---|
| 5,556,798 | 9/1996 | Hong . |
| 5,658,812 | 8/1997 | Araki ..................................... 438/258 |
| 5,792,670 | 8/1998 | Pio et al. . |
| 5,852,313 | 12/1998 | Hong et al. .............................. 257/326 |
| 5,960,283 | 9/1999 | Sato ......................................... 438/257 |
| 5,981,340 | 11/1999 | Chang et al. ........................... 438/258 |
| 5,989,960 | 11/1999 | Fukase .................................... 438/267 |
| 5,994,186 | 11/1999 | Bergemont .............................. 438/257 |

*Primary Examiner*—Richard Booth
*Attorney, Agent, or Firm*—Finnegan, Henderson, Farabow, Garrett & Dunner, L.L.P.

[57] ABSTRACT

High-concentrated impurity regions 24 for isolation of bit line contacts, having the same conduction type as that of a semiconductor substrate 10, are formed in the semiconductor substrate 10 under field oxide films 12 in locations between individual drain regions of selection transistors provided in a plurality of NAND memory cells, respectively. The high-concentrated impurity regions 24 for isolation of bit line contacts are made in a common step of making high-concentrated impurity regions 26 for isolation of memory transistors, by implanting impurities into the semiconductor substrate 10 through slits 20a, 20b made in a first conductive film 20. The high-concentrated impurity regions 24 prevent the punch-through phenomenon between bit line contacts 42a, and improve the resistivity to voltage between the bit line contacts 42a.

6 Claims, 11 Drawing Sheets

NONVOLATILE SEMICONDUCTOR STORAGE DEVICE AND ITS MANUFACTURING METHOD

BACKGROUND OF THE INVENTION

1. Field of the Invention

This invention relates to an electrically rewritable nonvolatile semiconductor storage device, particularly one called flash memory improved in element separability between bit lines, and to its manufacturing method.

2. Description of the Prior Art

NAND cell-type EEPROM is known as one of nonvolatile semiconductor storage devices enabling high integration, i.e., flash memory devices. It comprises a plurality of memory transistors connected in series for respective adjacent ones to share each source/drain region in each unit, and each unit forms a NAND memory cell. Memory transistors, in general, have a FET-MOS structure stacking a floating gate for accumulating an electric charge and a control gate. The drain side of a NAND memory cell is connected to a bit line through a selection gate, and its source side is connected to a source line through a selection gate. Control gates of NAND memory cells are aligned successively in the row directions to form word lines.

Data writing operation of NAND cell-type EEPROM follows the process explained below. A write potential (18 V, for example) is applied to the control gate of a selected memory transistor whereas an intermediate potential (about 8 V, for example) is applied to control gates of the other non-selected memory transistors. 0 V or the source voltage (about 3.3 V, for example), depending on data, is applied to bit lines. When 0 V is applied to a bit line, the potential is transmitted to the drain region of the selected memory transistor via non-selected memory transistors. Then, electrons are injected from the drain region into the floating gate by F-N tunneling, and the threshold value of the selected memory transistor is shifted forward. This state is determined as 0, for example. When the source voltage (about 3.3 V, for example) is applied to the bit line, selection gates are cut off, and the potential at the channel portion of the selected memory transistor is raised by the writing potential applied to the control gate of the selected memory transistor and the intermediate potential applied to control gates of non-selected memory transistors. Therefore, electron injection does not occur, and the threshold value remains negative. This state is determined 1, for example. This is the writing operation.

When the element separation width is narrowed along with progressive micro-miniaturization, the resistivity to voltage at the bit line contacts where bit lines contact the drain regions of selection gates arises as a problem. That is, it becomes difficult to maintain the resistivity to a punch-through voltage between neighboring bit line contacts with a certain margin. If a NAND memory cell for writing 0 and another NAND memory cell for writing 1 are adjacent to each other, and the resistivity to a punch-through voltage between their bit contacts is insufficient, the potential of the source voltage applied for writing 1 leaks to the adjacent bit line contact. Therefore, the drain of the NAND memory cell having the memory transistor which should write 1 cannot rise to the source voltage (about 3.3 V, for example), and results in writing 0. That is, erroneous writing occurs. Therefore, it is important to provide a sufficient margin, taking differences in resistivity to the punch-through voltage among bit line contacts into account.

Element isolation between adjacent bit line contacts so far relied on field implanted regions formed by impurity ions implanted upon making a field oxide film. Therefore, in a structure with a narrow element separation width, the margin against punch-through was very small. In a structure with an increased dose amount of impurity ions implanted upon making the field implanted region for the purpose of increasing the punch-through margin, other problems occurred, such as diffusion of excessive impurities into the channel region, and an increase in capacitance between the channel region and the field implanted region. Diffusion of excessive impurities into the channel region reduces the cell current, and hence decreases the margin for read-out operation. Moreover, an increase in capacitance between the channel region and the field region makes it difficult for bit lines of memory transistors not for writing during writing operation to rise, and makes error writing to occur more often. These reasons were the bars against the approach relying on increasing the dose amount of impurity ions implanted into the field implanted region upon making the field oxide film.

NAND cell-type EEPROM needs at least the source voltage (about 3.3 V, for example) as the resistivity to punch-through voltage between bit line contacts. Moreover, it needed at least the writing voltage (about 18 V, for example) as the resistivity to field inversion voltage of memory transistors of adjacent NAND memory cells.

SUMMARY OF THE INVENTION

It is therefore an object of the invention to improve the resistivity to punch-through voltage between bit line contacts 42a, that is, to improve the resistivity to punch-through voltage between bit line contacts 42a where bit lines connect to drain regions 32 for selection transistors.

Another object of the invention is to promote micro-miniaturization of nonvolatile semiconductor storage devices by improvement in resistivity to punch-through voltage.

According to the invention, there is provided a nonvolatile semiconductor storage device comprising:

a semiconductor substrate;

a plurality of memory transistors aligned in row and column directions on said semiconductor substrate, a plurality of the memory transistors connected in series in the column direction forming a NAND memory cell;

a plurality of selection transistor to connect or disconnect the memory transistors to or from bit lines for delivering signals to the memory transistors;

a plurality of field oxide films formed on the semiconductor substrate between individual memory transistors adjacent in row directions and between individual selection transistors adjacent in row directions to isolate individual memory transistors and individual selection transistors;

a plurality of field implanted regions formed in the semiconductor substrate under the field oxide films and having the same conduction type as that of the semiconductor substrate;

a plurality of first impurity regions formed in the semiconductor substrate under the field oxide films in locations between individual memory transistors adjacent in row directions, the first impurity regions having the same conduction type as that of the semiconductor substrate and having a higher concentration than that of the field implanted regions; and a plurality of second impurity regions formed in the semiconductor substrate under the field oxide films in locations between connected portions of individual bit lines adjacent in row directions with the selection transistors, the second impurity regions having the same conduction type as that of the semiconductor substrate and having a higher concentration than that of the field implanted regions.

There is also provided a method for manufacturing a nonvolatile semiconductor storage device including a plurality of units having a plurality of memory transistors connected in series, a selection transistor connected in series to the memory transistor, and a bit line connected to a drain region of the selection transistor, comprising the steps of:

making slits in a conductive film for making floating gates in locations between individual memory transistors, and implanting impurities through the slits to form impurity regions between the memory transistors; and making slits in the conductive film in locations between individual drain regions of the selection transistors, and implanting impurities through the slits to form impurity regions between the drain regions of the selection transistors.

There is further provided a method for manufacturing a nonvolatile semiconductor storage device, comprising the steps of:

forming a plurality of field oxide films in a parallel alignment on a semiconductor substrate;

forming a first insulation film on the semiconductor substrate in a location between respective field oxide films;

forming a first conductive film on the first insulation film;

making slits in the conductive film in locations between regions for making memory transistors above the field oxide films;

making slits in the first conductive film in locations between regions for making bit line contacts above the field oxide films;

implanting impurities of the same conduction type as that of the semiconductor substrate through the slits in the first conductive film to form impurity regions in the semiconductor substrate under the field oxide films;

forming a second insulation film on the first conductive film and on the field oxide films;

forming a second conductive film on the second insulation film;

selectively etching the first conductive film to make floating gates;

selectively etching the second conductive film to make control gates;

forming source/drain regions corresponding to respective control gates and selection gates;

forming a third insulation film on the source/drain regions and on the control gates; and forming bit lines on the third insulation film in contact with the selection gates and the drain regions to form bit line contacts.

DETAILED DESCRIPTION OF THE PREFERRED EMBODIMENTS

Figures 10A, 10B, 10C:
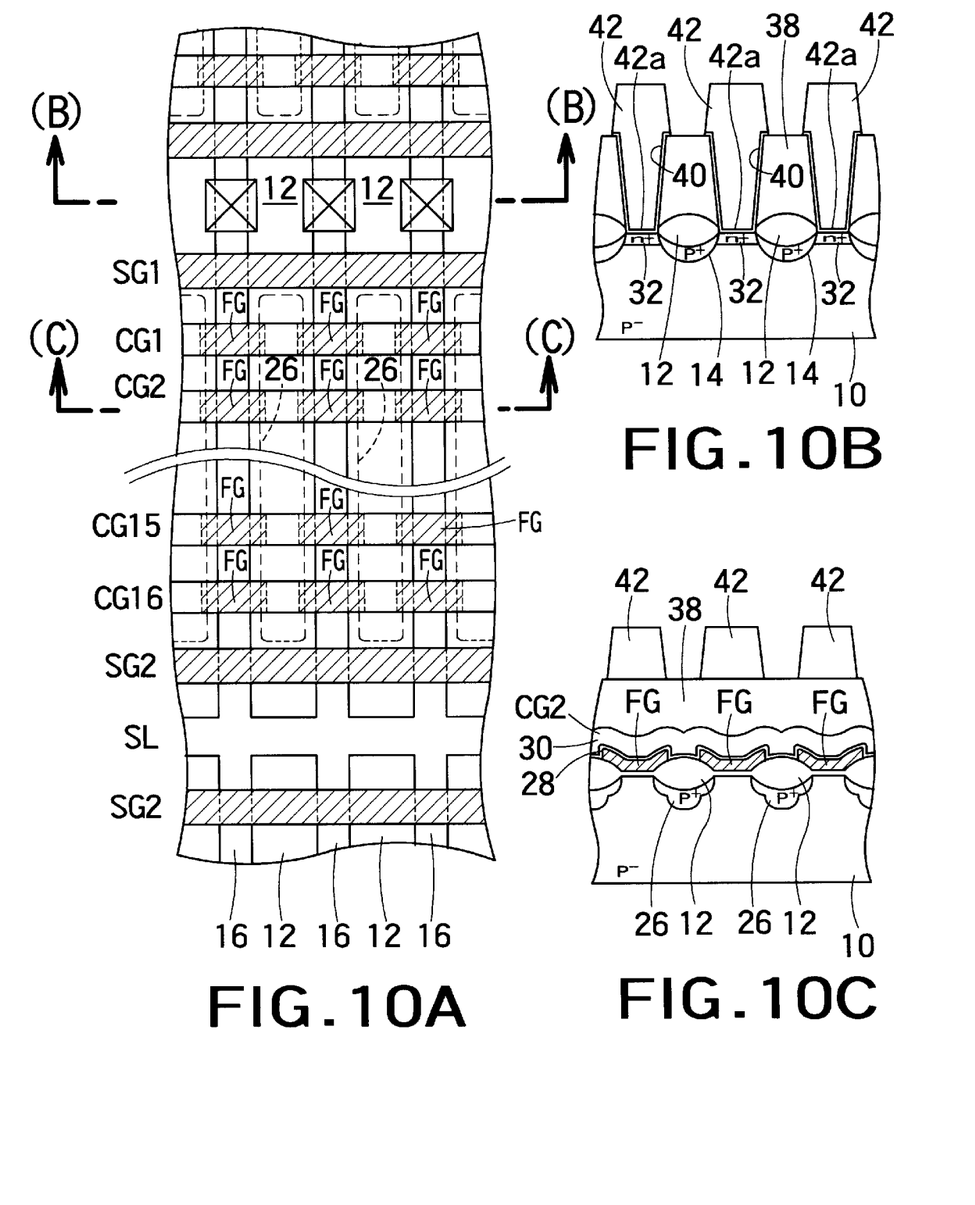
FIGS. 10A, 10B and 10C are diagrams of an existing nonvolatile semiconductor storage device.
Figure 11:
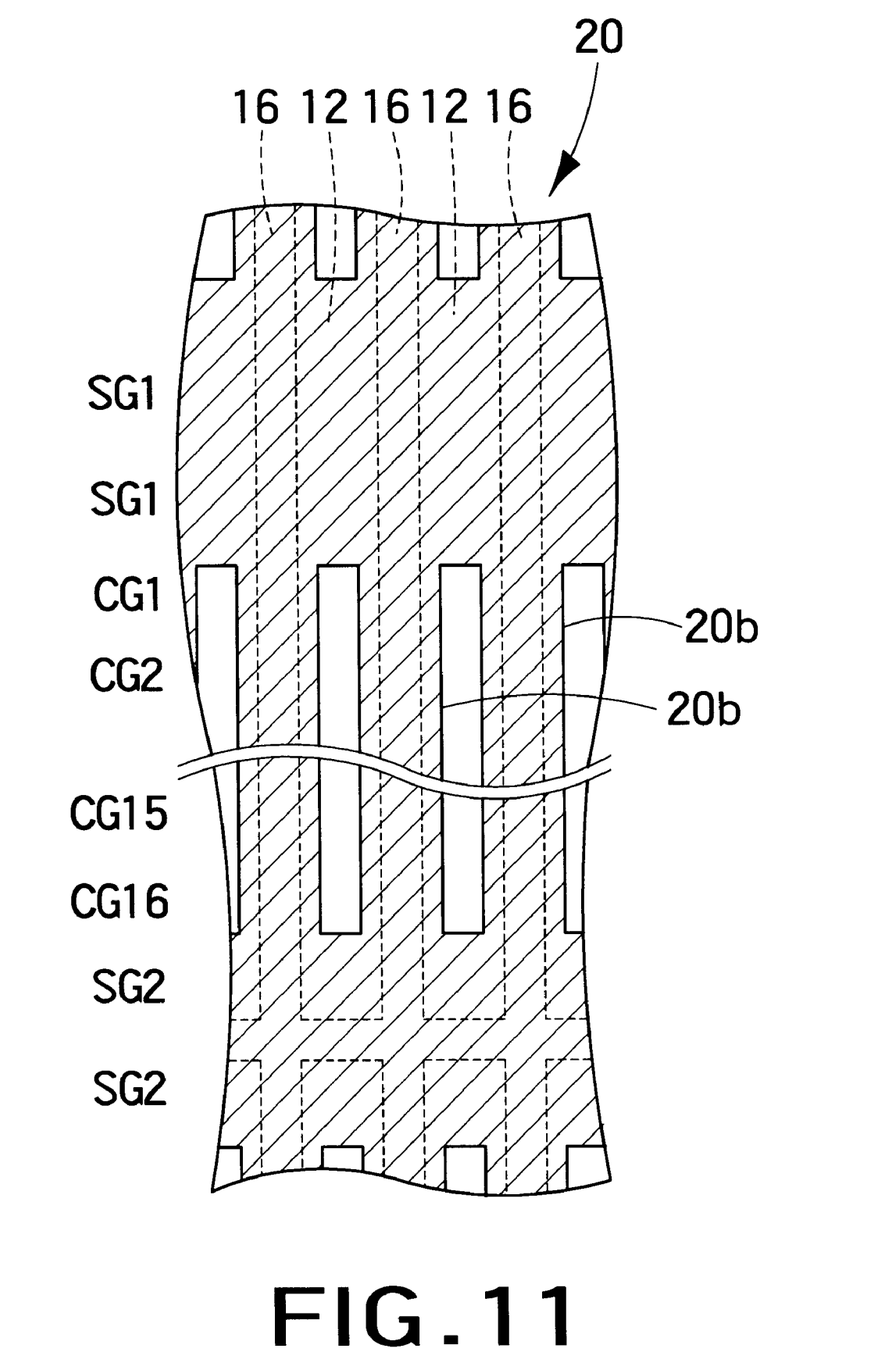
FIG. 11 is a diagram showing a part of a process for manufacturing the existing nonvolatile semiconductor storage device.

Under the situation, there is a nonvolatile semiconductor storage device shown in FIGS. 10A through 10C and 11 as one of conventional technologies, which is familiar with the inventors. FIG. 10A is a plan view of the nonvolatile semiconductor storage device, and FIGS. 10B and 10C are cross-sectional views taken along the (b)—(b) line and the (c)—(c) line of FIG. 10A, respectively. FIG. 11 is a diagram illustrating an electrically conductive film 20 made of polysilicon for making floating gates under a step of a process of manufacturing the nonvolatile semiconductor storage device.

As shown in FIGS. 10A through 10C, the nonvolatile semiconductor storage device has formed high-concentrated impurity regions 26 for memory transistors on a semiconductor substrate 10 in locations between memory transistors to improve the resistivity to voltage between memory transistors of adjacent NAND memory cells. That is, by additionally implanting into the semiconductor substrate impurity ions of the same conduction type as that of the semiconductor substrate 10, the resistivity to field inversion voltage between memory transistors of adjacent NAND memory cells is improved.

It is known from FIG. 11 that the high-concentrated impurity region 26 for memory transistors were made by implanting impurity ions through slits 20b formed in the conductive film 20. That is, the conductive film 20 for making floating gates FG was formed on the semiconductor substrate 10 having formed the field oxide film 12, and slits 20b were made in the conductive film 20. The slits 20b separated floating gates FG of extending over respective adjacent NAND memory cells into discrete parts for individual NAND memory cells. By additionally implanting impurity ions of the same conduction type as that of the semiconductor substrate 10 through the slits 20b into the semiconductor substrate 10, high-concentrated impurity regions 26 for memory transistors were formed.

As known also from FIG. 10B, additional impurity ions were so far implanted only between memory transistors. Therefore, element separability between bit line contacts 42a merely relied on the field implanted regions 14 ion-implanted upon making the field oxide film 12. As a result, the resistivity to punch-through voltage between bit line contacts 42a was left under serious situations as the element separation width wad made smaller and smaller. That is, the resistivity to voltage between bit line contacts 42a so far disturbed micro-miniaturization of nonvolatile semiconductor storage devices.

In the first embodiment of the invention, when high-concentrated impurity regions are formed between memory transistors by implanting impurities through slits formed between memory transistors of a conductive film for making floating gates, additional slits are made also between drain regions of selection transistors, and impurities are implanted through the additional slits to form high-concentrated impurity regions between the drain regions of the selection transistors. This is for the purpose of improving the resistivity to voltage between bit line contacts where drain regions of selection transistors connect to the bit lines. The embodiment is explained below in detail.

FIGS. 1A through 6C are diagrams the nonvolatile semiconductor storage device according to the embodiment under different steps of a manufacturing process. Figures numbered with the suffix A are plan views, those numbered with the suffix B are cross-sectional views taken along B—B line of corresponding plan views, and those with the suffix C are cross-sectional view taken along C—C lines of corresponding plan views.

Figures 1A, 1B:
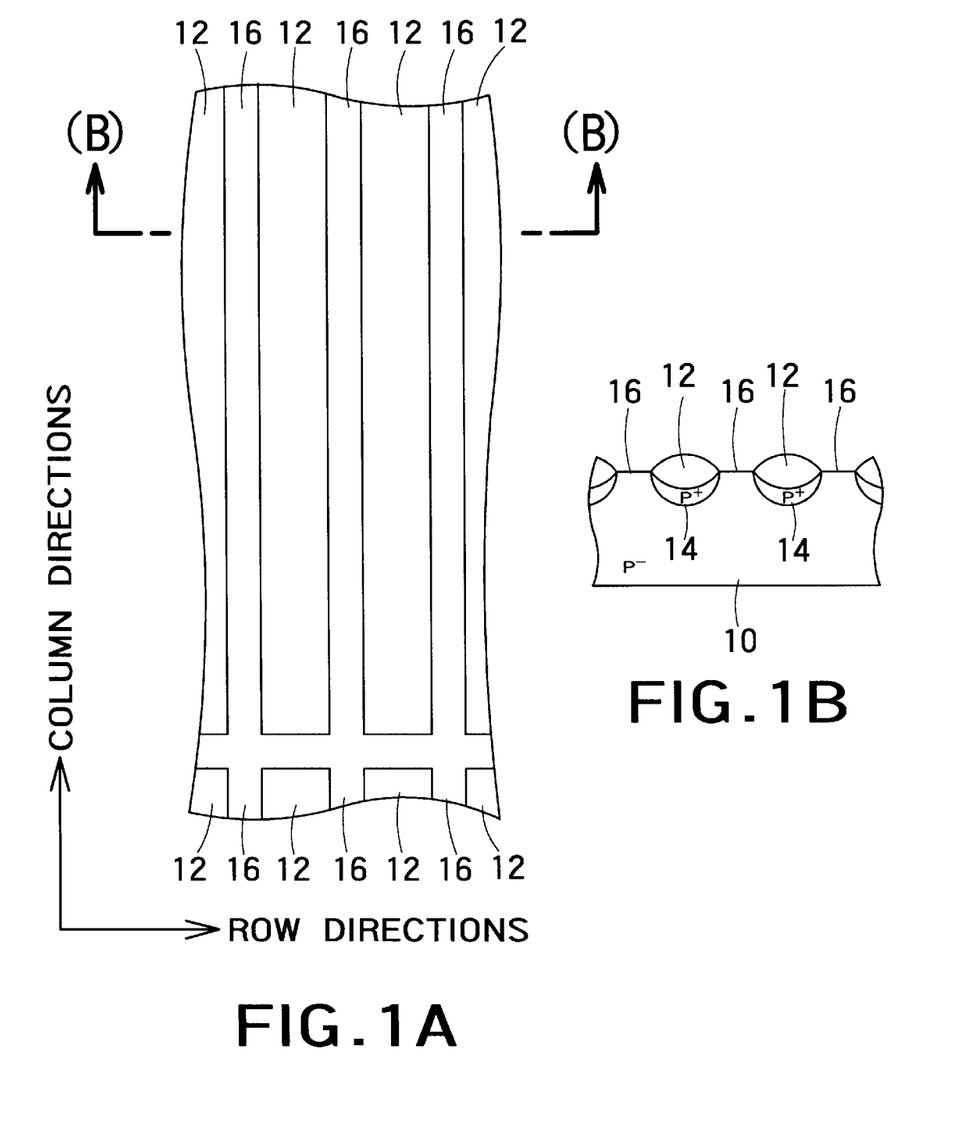
FIGS. 1A and 1B are diagrams showing a part of a process of manufacturing a nonvolatile semiconductor storage device according to an embodiment of the invention.

With reference to FIGS. 1A and 1B, a plurality of elongated field oxide films 12 for separating elements are formed in parallel on a semiconductor substrate 10. That is, by implanting B$^-$ ions (boron ions), for example, into selective regions of the p$^-$-type semiconductor substrate 10, p$^+$-type field implanted regions 14 are formed. Next using a nitride film as a mask, a plurality of thick field oxide films 12 are formed in selective regions in column directions on the semiconductor substrate. Spaces between the field oxide films 12 are element regions (SDG) 16 where NAND memory cell, explained later, are to be formed.

Figures 2A, 2B:
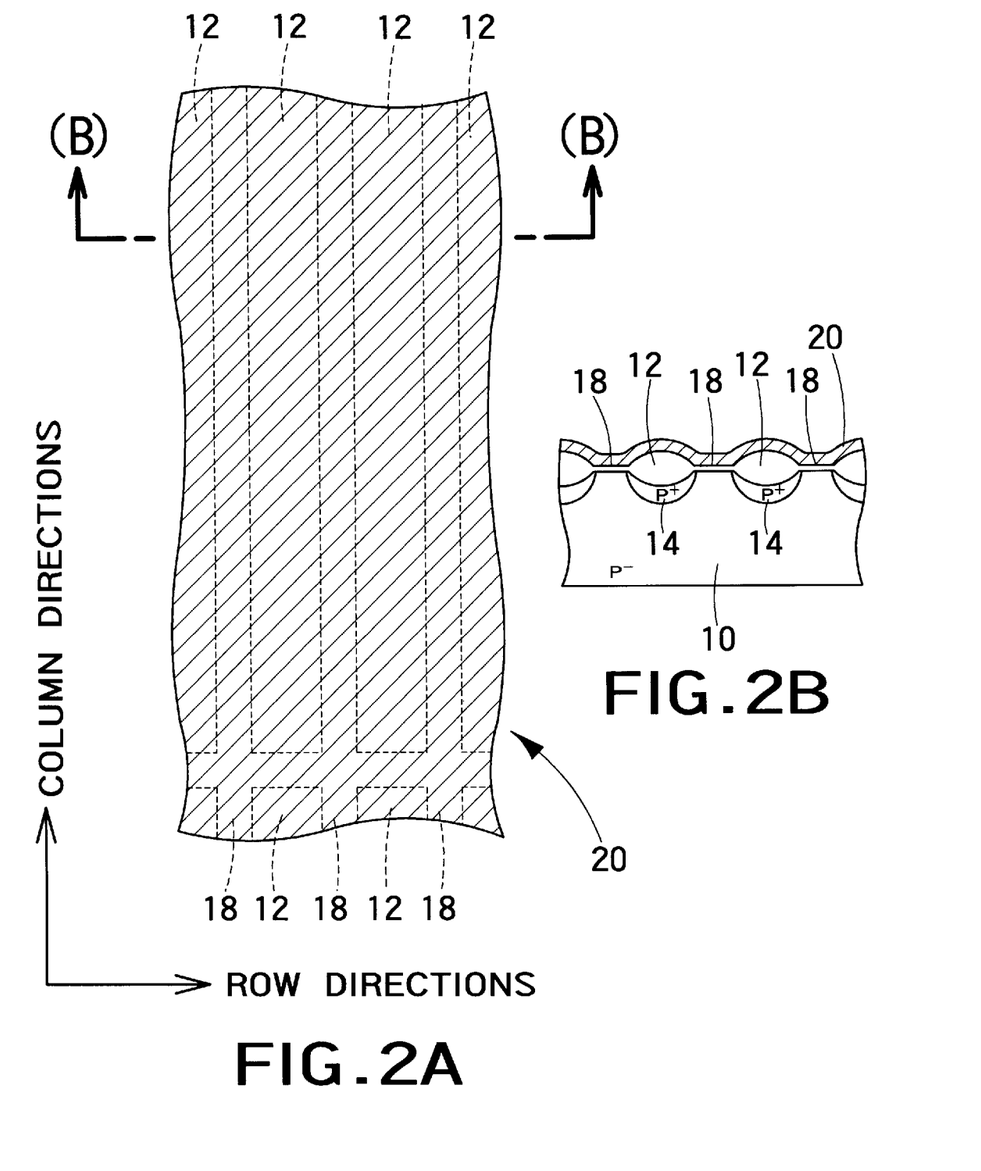
FIGS. 2A and 2B are diagrams showing a part of the process of manufacturing the nonvolatile semiconductor storage device according to the embodiment of the invention.

Next referring to FIGS. 2A and 2B, a gate oxide film (first insulation film) 18 is formed on the semi-product of the nonvolatile semiconductor storage device by oxidization. Further formed on the gate oxide film 18 is a first conductive film 20 made by polysilicon by CVD (chemical vapor deposition). The first conductive film 20 is reduced in resistance by doping phosphorus, or the like.

Figure 3A:
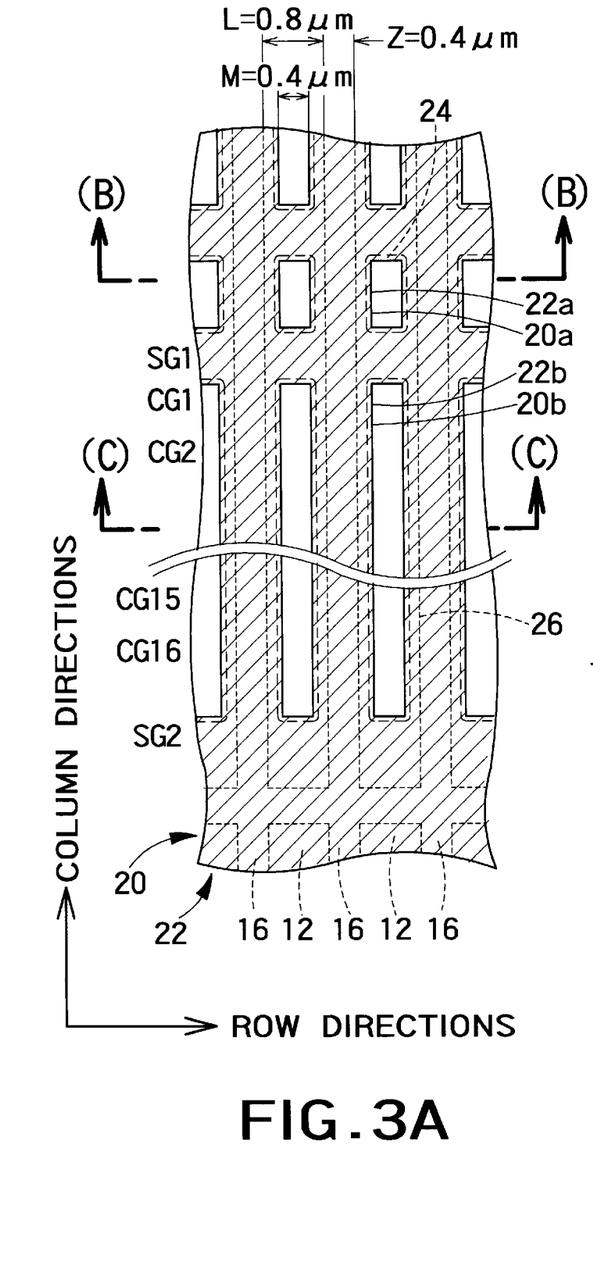
FIGS. 3A, 3B and 3C are diagrams showing a part of the process of manufacturing the nonvolatile semiconductor storage device according to the embodiment of the invention.
Figure 3B:
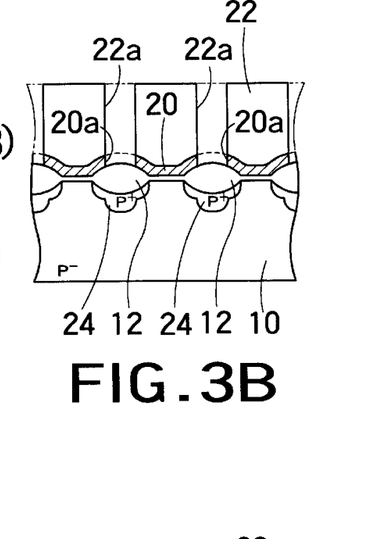
Figure 3C:
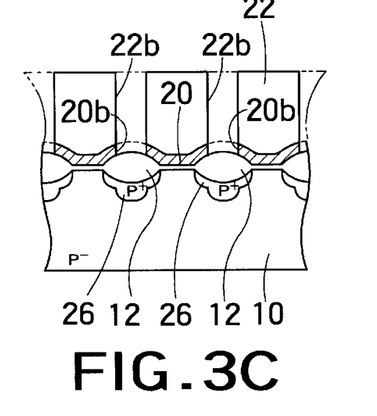

Next referring to FIGS. 3A through 3C, a photo resist is applied patterned on the first conductive film 20 to make a photo resist layer 22. That is, by making apertures 22a, 22b in the photo resist by photolithography to make the photo resist layer 22. After that, slits 20a, 20b are made in the first conductive film 20 by RIE (reactive ion etching). The illustrated pattern of the slits 20a, 20b is employed to leave selective regions of the first conductive film 20 necessary for making selection gates SG1, SG2 in alignment in the row directions. Through these slits 20a, 20b, additional B$^-$ ions (boron ions), for example, are implanted into the semiconductor substrate 10. That is, impurities of the same conduction type as that of the semiconductor substrate 10 are implanted. As a result, p$^+$-type high-concentrated impurity regions 24 for isolation of bit line contacts and p$^+$-type high-concentrated impurity regions 26 for isolation of memory transistors are formed in selective regions of the semiconductor substrate 10 located under the field oxide films 12. That is, p$^+$-type high-concentrated impurity regions 24 for isolation of bit line contacts are formed to enclose regions where bit line contacts should be made, and p$^+$-type high-concentrated impurity regions 26 for isolation of memory transistors are formed to enclose regions where memory transistors should be made.

Figure 4A:
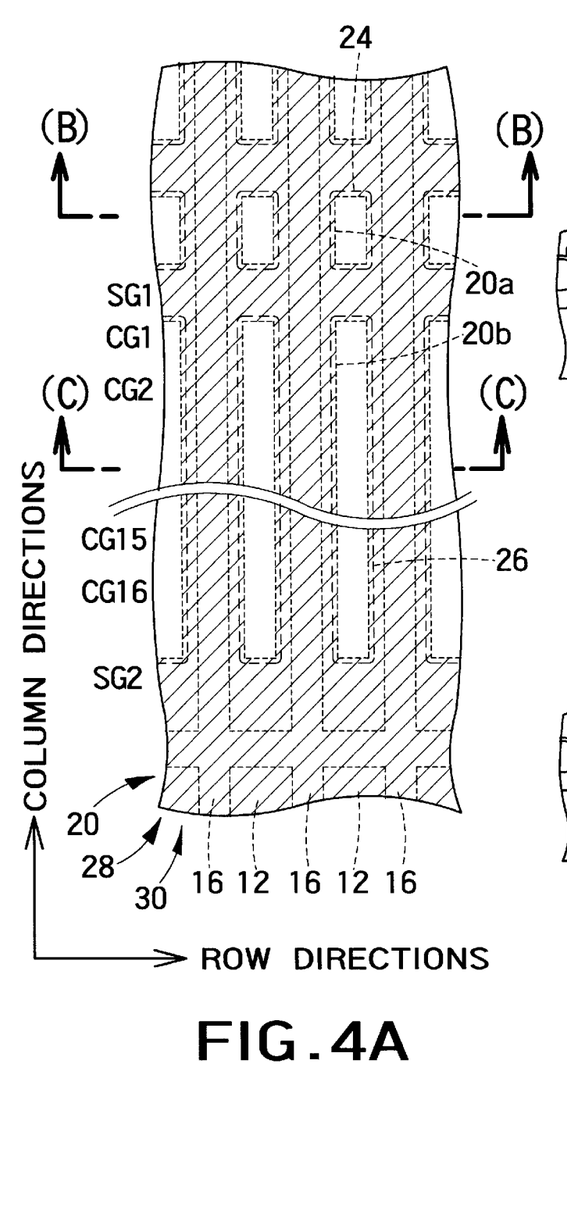
FIGS. 4A, 4B and 4C are diagrams showing a part of the process of manufacturing the nonvolatile semiconductor storage device according to the embodiment of the invention.
Figure 4B:
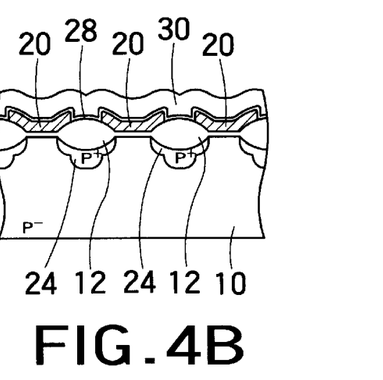
Figure 4C:
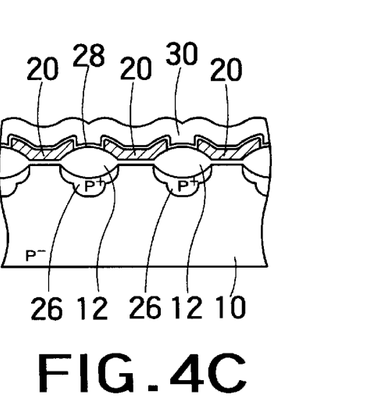

Next referring to FIGS. 4A through 4C, the photo resist layer 22 is removed thereafter. Then, an ONO (oxide-nitride-oxide) film (second insulation film) 28 is formed on the semi-product of the nonvolatile semiconductor storage device by oxidization or CVD. Next formed on the ONO film 28 is a second conductive film 30 made of polysilicon, for example, by CVD. The second conductive film 30 is decreased in resistance by doping phosphorus, for example.

Figures 5A, 5B, 5C:
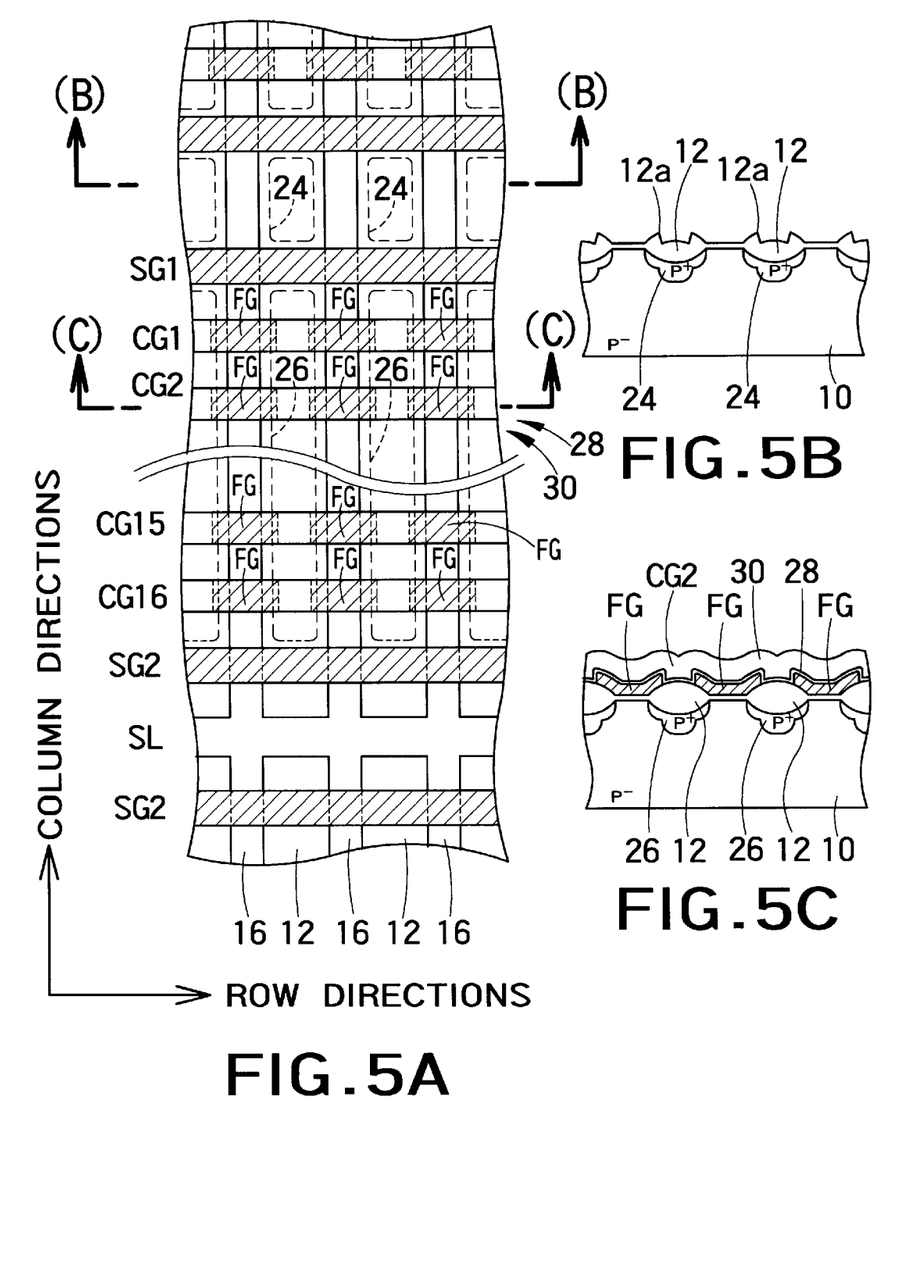
FIGS. 5A, 5B and 5C are diagrams showing a part of the process of manufacturing the nonvolatile semiconductor storage device according to the embodiment of the invention.

Next referring to FIGS. 5A through 5C, gate processing is done. That is, using photolithography and RIE, the first conductive film 20, ONO film 28 and second conductive film 30 are selective removed in row directions. As a result, selection gates SG1, SG2, control gates CG1 through CG16, and floating gates FG are formed. Selection gates SG1 and SG2 are continuous in row directions. The control gates CG1 through CG16 are continuous in row directions to make word lines. At that time, as shown in FIG. 5B, recesses 12a are inevitably formed in the field oxide film 12. That is, when the first conductive film 20, ONO film 28 and second conductive film 30 are removed simultaneously from regions for bit line contacts by RIE, recesses 12a are formed inevitably. Because, as shown in FIG. 2B, there are portions without the first conductive film 20 on the field oxide film 12 in regions for bit line contacts, and RIE for removal of the ONO film 28 results in partly removing the field oxide film 12 altogether.

Figure 6A:
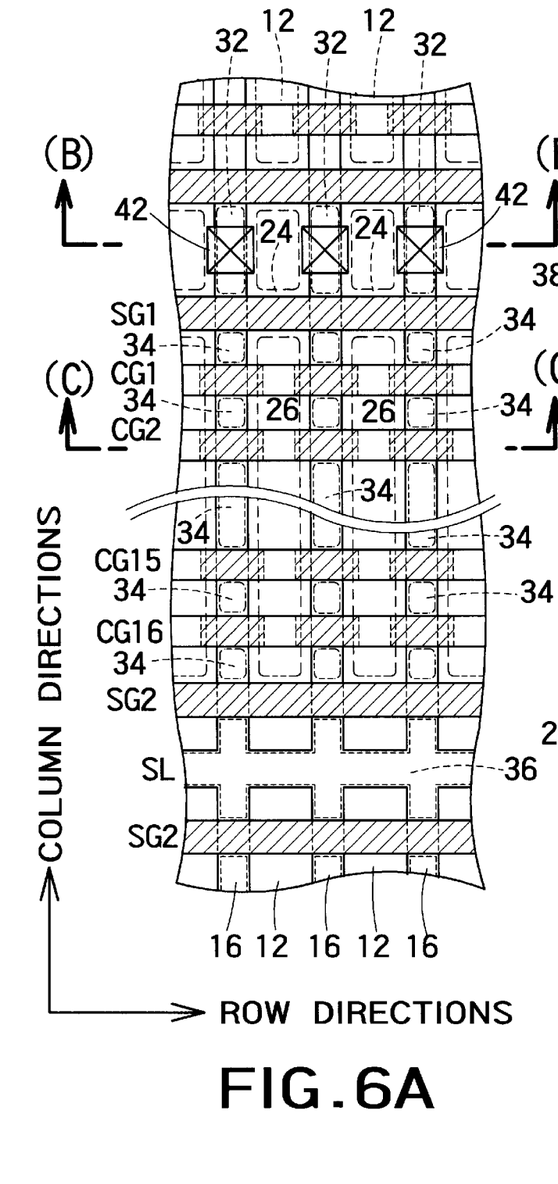
FIGS. 6A, 6B and 6C are diagrams showing a part of the process of manufacturing the nonvolatile semiconductor storage device according to the embodiment of the invention.
Figure 6B:
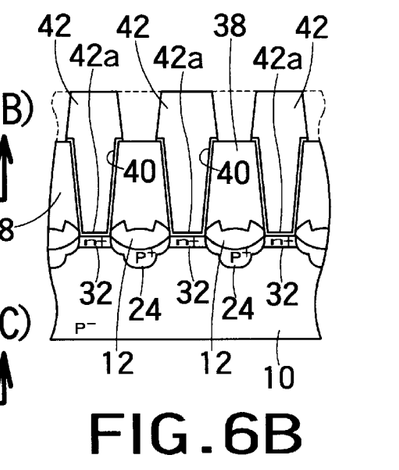
Figure 6C:
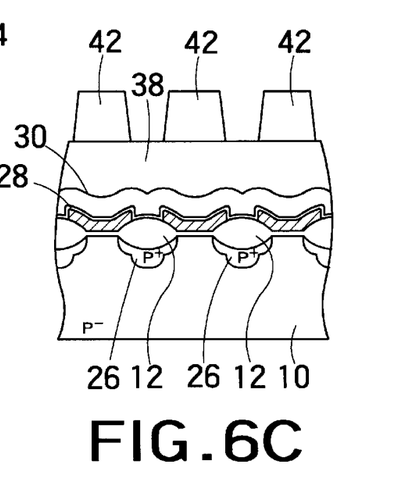

Next referring to FIGS. 6A through 6C, P$^+$ ions (phosphorus ions), As$^+$ ions (arsenide ions), or the like, are implanted to form n$^-$-type regions and n$^+$-type regions. These regions form drain regions 32 for selection transistors, source/drain regions 34 for memory transistors, and common source line regions 36. That is, source/drain regions corresponding to selection gates SG1, SG2 and control gates CG1 through CG16 are formed. In this embodiment, serially connected 16 memory transistors form a NAND memory cell. Additionally, selection transistors are connected in series to the source side and the drain side of the NAND memory cell. After that, an inter-layer insulation film (third insulation film) 38 is formed on the semi-product of the nonvolatile semiconductor storage device by CVD. Then, contact holes 40 are made by photolithography and RIE in the inter-layer insulation film 38 above the drain regions 32 for selection transistors. Through the contact holes 40, As$^+$ ions (arsenide) ions, for example, are additionally implanted into the drain regions 32 for selection transistor. That is, re-diffusion implantation is done. After that, a barrier metal layer and an aluminum wiring layer are staked on the semi-product of the nonvolatile semiconductor storage device by sputtering, and then selectively removed by photolithography and RIE to form bit lines 42. Concurrently, as best shown in FIG. 6B, bit lines 42 extend into the contact holes 40, and connect to the drain regions 32 for selection transistors. The connected points form bit line contacts 42a.

Figures 7A, 7B, 7C:
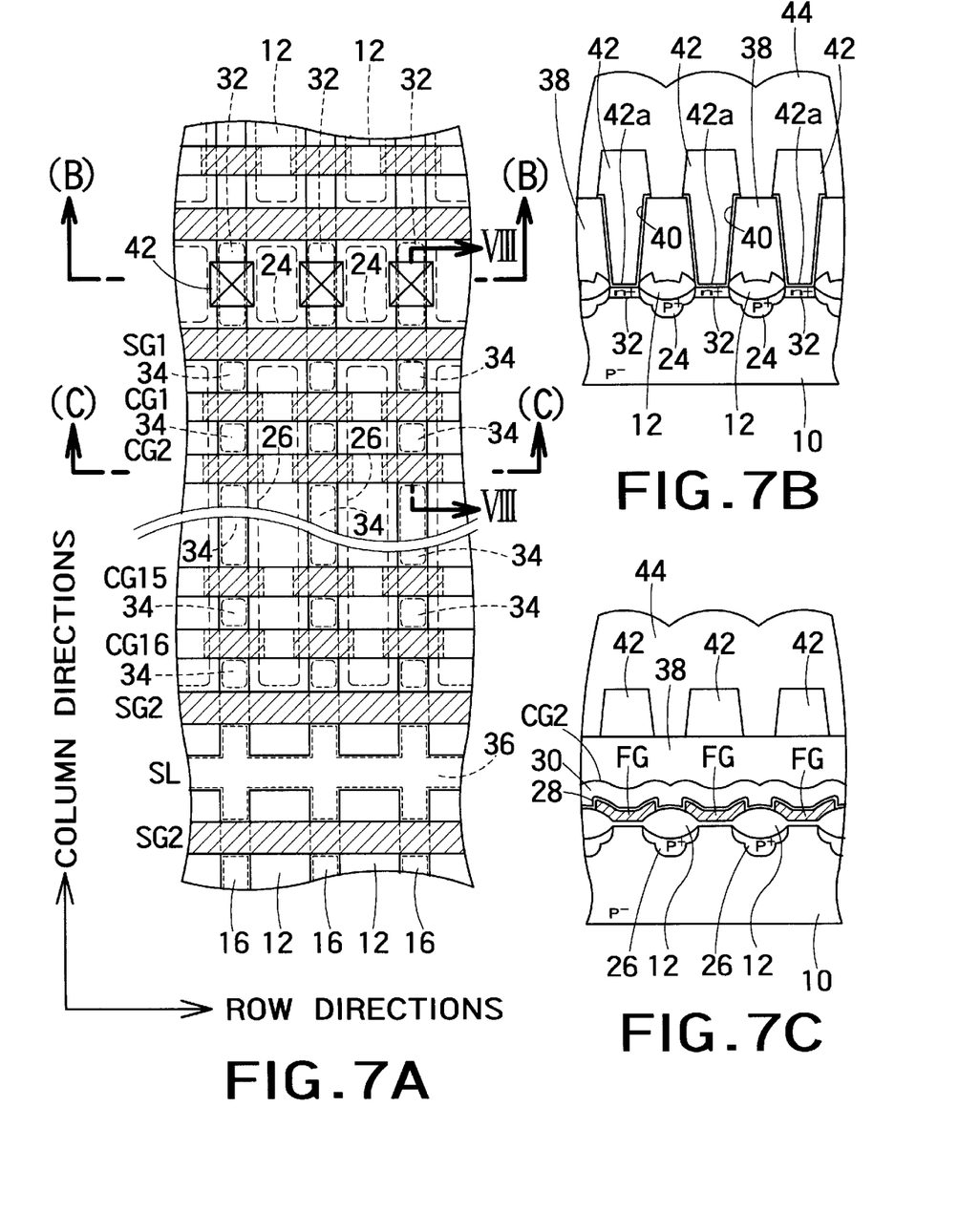
FIGS. 7A, 7B and 7C are diagrams showing a part of the process of manufacturing the nonvolatile semiconductor storage device according to the embodiment of the invention.

Next referring to FIGS. 7A through 7C, a passivation film 44 is formed on the semi-product of the nonvolatile semiconductor storage device by CVD. The passivation film 44 behaves as a surface protective film. After these steps, the nonvolatile semiconductor storage device is completed.

Figure 8:
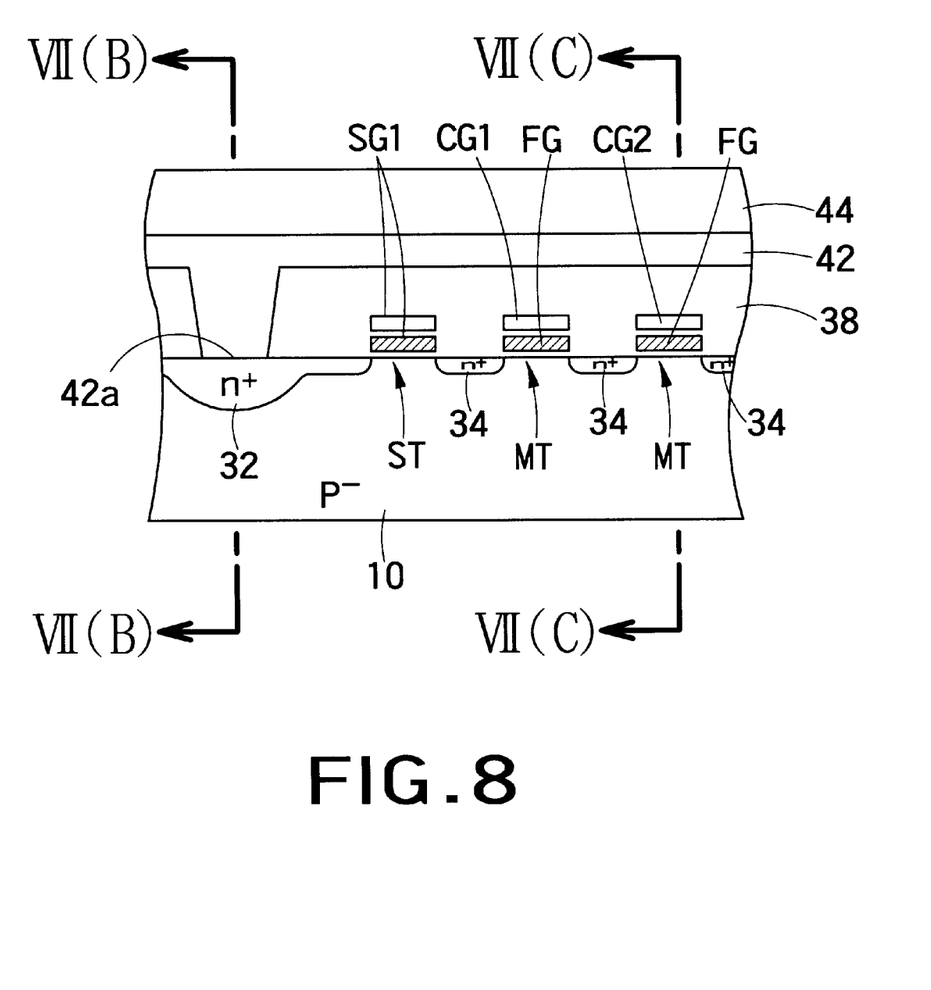
FIG. 8 is a cross-sectional view taken along the VIII—VIII line of FIG. 7.

FIG. 8 is a cross-sectional view taken along the VIII—VIII line of FIG. 7A. As shown in FIG. 8, bit lines 42 are connected to drain regions 32 of selection transistors, which are drain regions of the selection gates SG1, to form bit line contacts 42a. Each n+-type selection transistor drain region 32, n+-type memory transistor source/drain region 34 and selection gate SG1 form a FET-MOS selection transistor ST. Each n+-type memory transistor source/drain regions 34, 34 and control gate CG form a FET-MOS memory transistor MT. Selection transistors ST behaves to transmit or block a signal between memory transistors MT and bit lines 42.

As explained above, the embodiment is configured to make p+-type high-concentrated impurity regions 24 for isolation of bit line contacts in the semiconductor substrate under the field oxide film 12 as shown in FIG. 7B. That is, high-concentrated impurity regions 24 for isolation of bit line contacts are formed between individual bit line contacts 42a, 42a. Therefore, the punch-through phenomenon between bit line contacts 42a, 42a can be prevented. That is, extending the depletion layer between selection transistor drains 32, 32 and contacting them each other can be prevented. Thus, the resistivity to punch-through voltage can be improved.

Figure 9A:
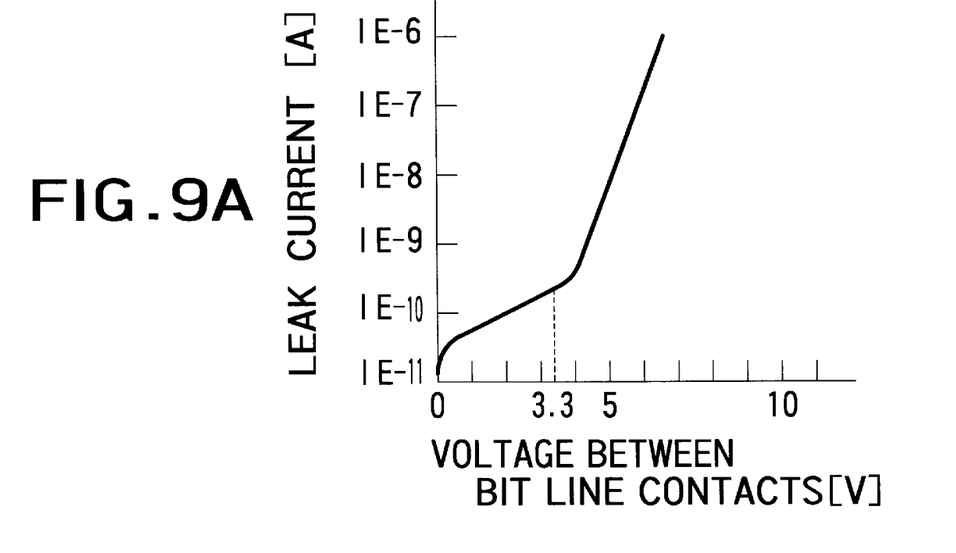
FIGS. 9A and 9B are diagrams relations of voltage and leak current between bit line contacts in the nonvolatile semiconductor storage device according to the embodiment in comparison with an existing nonvolatile semiconductor storage device.
Figure 9B:
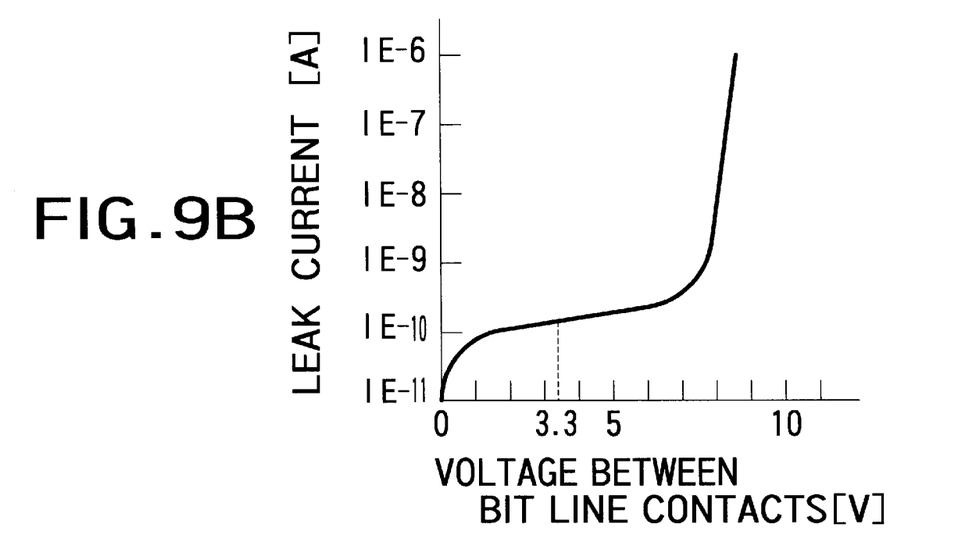

FIGS. 9A and 9B are graphs showing the effect of the embodiment in practice in comparison with the conventional one. FIG. 9A shows changes in resistivity to voltage between bit line contacts 42a in the conventional nonvolatile semiconductor storage device shown in FIG. 10, and FIG. 9B shows changes in resistivity to voltage between bit lines contacts 42a in the nonvolatile semiconductor storage device according to the embodiment. They show experimental results obtained by using a test pattern for monitoring the resistivity to voltage between bit line contacts 42a, 42a. More specifically, with reference to FIG. 3A, the element separation width L, which is the width of the field oxide film 12, is 0.8 μm, the slit width M, which is the width of the slit 20a, is 0.4 μm, and the element region width N, which is the width of the element region 16, is 0.4 μm. Impurity ions implanted for making the high-concentrated impurity regions 24 for isolation of bit line contacts are B− ions (boron ions), and their dose amount is 2E14/cm². The impurity implanted upon making the field oxide film 12 to form the field implanted region 14, as shown in FIG. 1B, are B− ions (boron ions), and their dose amount is 5E13/cm². Changes in resistivity to voltage between bit line contacts 42 were monitored on approximately pairs of bit line contacts made under these conditions.

It is confirmed from FIG. 9A that, in the conventional nonvolatile semiconductor storage device, leak current suddenly increases when a voltage of 3 to 4 V or more is applied between bit line contacts 42a. That is, the resistivity voltage between bit line contacts is only 3 V through 4 V, approximately. Taking the voltage applied to the bit line contacts 42a into account, the maximum potential difference from the source voltage (about 3.3 V, for example) applied for data writing is 0 V. Therefore, 3.3 V and 0 V may be applied to adjacent bit lines 42, 42. In this case, in the conventional nonvolatile semiconductor storage device, the resistivity to voltage between bit line contacts 42a is not sufficient. That is, the punch-through phenomenon occurs between bit line contacts 42a, and a leak current flows. Due to the leak current, the drain 32 of the selection transistor along a bit line 42 applied with 3.3 V cannot rise to 3.3 V, and erroneous writing occurs.

In contrast, it is confirmed from FIG. 9B that, in the nonvolatile semiconductor storage device according to the embodiment, leak current begins to increase when a voltage 7 V to 8 V or more is applied between the bit line contact 42a. That is, the resistivity to voltage between bit line contacts 42a is as high as 7 V to 8 V. Therefore, even when different voltage, 3.3 V and 0 V, are applied to adjacent bit lines 42, 42, the device can resist sufficiently. That is, since isolation between bit line contacts 42a is amply resistive to a punch through voltage, leak current seldom flows, and erroneous writing seldom occurs. Additionally, the improved resistivity to punch-through voltage enables further micro-miniaturization of nonvolatile semiconductor storage devices.

Moreover, since p+-type high-concentrated impurity regions 26 for isolation of memory transistors are formed between individual memory transistor regions in the same step as that for forming p+-type high-concentrated impurity regions 26 for isolation of bit line contacts between individual memory transistor regions, the number of steps in the manufacturing process need not be increased. That is, since additional B− ions (boron ions), or the like, are implanted into the semiconductor substrate 10 through the slits 20a, 20b formed in the first conductive film 20, no additional step is required. Thus, the resistivity to punch-through voltage between bit line contacts 42a can be improved without requiring additional step.

The invention is not limited to the specific embodiment explained above, but may be modified in various modes. For example, the number of memory transistors is not limited to 16, but may be one, two or four, for example. Although the foregoing embodiment has been explained as employing NAND cell-type EEPROM, the invention is substantially directly applicable also to NOR cell-type EEPROM having selection gates.

Moreover, by diffusing impurities in column directions after making high-concentrated impurity regions 24 for isolation of bit line contacts and high-concentrated impurity regions 26 for isolation of memory transistors as shown in FIG. 7A, these high-concentrated impurity regions 24 and 26 can be extended into below the selection gates SG1. Then, the high-concentrated impurity regions 24 for isolation of bit line contacts and the high-concentrated impurity regions 26 for isolation of memory transistors become closer to each other, and further improve the resistivity to voltage between bit line contacts.

Additionally, with reference to FIG. 3A, sizes of the slits 20a, 20b made in the first conductive film 20 can be determined as desired. That is, lengths of slits 20a, 20b in the column direction, i.e. in their lengthwise direction, can be determined within the range preventing step-off breakage of the first conductive film 20 forming selection gates SG1 and SG2. Widths of slits 20a, 20b in the row direction, i.e. in the direction of their short sides, can be determined appropriately within a range narrower than the width of the field oxide film 12 from the viewpoint of processing.

As described above, according to the nonvolatile semiconductor storage device, since high-concentrated impurity regions of the same conduction type as that of the semiconductor substrate are formed in the semiconductor substrate in locations under the field oxide film between individual source/drain regions of selection transistors, the resistivity to voltage between bit line contacts can be improved.

What is claimed is:

1. A method for manufacturing a nonvolatile semiconductor storage device including a plurality of units having a plurality of memory transistors connected in series in a column direction, a selection transistor connected in series in the column direction to said memory transistors, and a bit line connected to a drain region of said selection transistor, said units aligned in a row direction, comprising the steps of:

making slits in a conductive film for making floating gates in locations between said memory transistors adjacent in the row direction, and implanting impurities through said slits to form impurity regions between said memory transistors adjacent in the row direction; and making slits in said conductive film in locations between said drain regions of said selection transistors in the row direction, and implanting impurities through said slits to form impurity regions between said drain regions of said selection transistors in the row direction.

2. The method according to claim 1 wherein the step of forming said impurity regions between the memory transistors in the row direction and the step of forming said impurity regions between the drain regions of the selection transistors in the row direction are executed simultaneously.

3. A method for manufacturing a nonvolatile semiconductor storage device, comprising the steps of:

forming a plurality of field oxide films in a parallel alignment on a semiconductor substrate;

forming a first insulation, film on said semiconductor substrate in a location between said field oxide films;

forming a first conductive film on said first insulation film;

making slits in said first conductive film in locations between regions for making memory transistors above said field oxide films;

making slits in said first conductive film in locations between regions for making bit line contacts above said field oxide films;

implanting impurities of the same conduction type as that of said semiconductor substrate through said slits in said first conductive film to form impurity regions in said semiconductor substrate under said field oxide films;

forming a second insulation film on said first conductive film and on said field oxide films;

forming a second conductive film on said second insulation film;

selectively etching said first conductive film to make floating gates;

selectively etching said second conductive film to make control gates;

selectively etching said first conductive film and said second conductive film to make selection gates;

forming source/drain regions corresponding to said control gates and said selection gates;

forming a third insulation film on said source/drain regions and on said control gates; and forming bit lines on said third insulation film in contact with said drain regions of said selection gates.

4. The method according to claim 3 wherein the step of making the slits in said first conductive film in locations between regions for making memory transistors above the field oxide films and the step of making the slits in said first conductive film in locations between regions for bit line contacts above said field oxide films are executed simultaneously.

5. The method according to claim 4 wherein said first conductive film is separated in the row directions by the step of making the slits in said first conductive film in locations between regions for making memory transistors above the field oxide films, and said first conductive film is separated in the column direction by the step of making the slits in said first conductive film in locations between regions for bit line contacts above said field oxide films.

6. The method according to claim 3 wherein field implanted regions having the same conduction type as that of said semiconductor substrate are formed in said semiconductor substrate in locations for making said field oxide films prior to the step of forming said field oxide films, and the step of forming said impurity regions implants impurities of the same conduction type as that of said semiconductor substrate into said field implanted regions.

* * * * *